United States Patent [19]

Van Vaals et al.

[11] Patent Number: 5,810,726
[45] Date of Patent: Sep. 22, 1998

[54] METHOD OF AND DEVICE FOR MAGNETIC RESONANCE IMAGING OF OBJECTS

[75] Inventors: Johannes J. Van Vaals; Hans H. Tuithof, both of Eindhoven, Netherlands

[73] Assignee: U.S. Philips Corporation, New York, N.Y.

[21] Appl. No.: 632,235

[22] Filed: Apr. 15, 1996

[30] Foreign Application Priority Data

May 2, 1995 [EP] European Pat. Off. .............. 95201136

[51] Int. Cl.$^6$ ................................................... A61B 5/055
[52] U.S. Cl. ............................................ 600/410; 324/309
[58] Field of Search ......................... 128/653.2; 324/307, 324/309, 312; 600/410

[56] References Cited

U.S. PATENT DOCUMENTS

| | | |
|---|---|---|
| 4,070,611 | 1/1978 | Ernst . |
| 4,830,012 | 5/1989 | Riederer .................................. 128/653 |
| 5,243,284 | 9/1993 | Noll . |
| 5,304,929 | 4/1994 | Fang et al. . |
| 5,361,028 | 11/1994 | Kanayama et al. ...................... 324/309 |
| 5,377,680 | 1/1995 | Bernstein et al. . |
| 5,431,163 | 7/1995 | Kaijyama . |
| 5,474,067 | 12/1995 | Laub . |
| 5,485,086 | 1/1996 | Meyer et al. . |
| 5,502,385 | 3/1996 | Kuhn et al. . |
| 5,587,657 | 12/1996 | Kanazawa . |
| 5,604,434 | 2/1997 | Schomberg . |

OTHER PUBLICATIONS

Craig H. Meyer, Bob S. Hu, Dwight G. Nishimura and Albert Macovski, "Fast Spiral Coronary Artery Imaging" Magnetic Resonance in Medicine 28, pp. 202–213, (1992).

Donald B. Twieg, "The K–Trajectory Formulation of the NMR Imaging Proccess with Applications in Analysis and Synthesis of Imaging Methods" Med. Phys. 10, Nr. 5, Sep./Oct. 1983, pp. 610–621.

Primary Examiner—Marvin M. Lateef
Assistant Examiner—Shawna J. Shaw
Attorney, Agent, or Firm—Jack D. Slobod; Dwight H. Renfrew

[57] ABSTRACT

A method of magnetic resonance imaging of a part of the body (106) arranged in a substantially uniform, static magnetic field where, in order to follow a dynamic process in the body, the temporal resolution is enhanced by successively generating MR signals which are associated with only a part of a reference set of lines in the k-space. After the generating and sampling of a series of MR signals associated with the lines of the part of the reference set, a reconstruction set is renewed and an image of the part of the body is reconstructed from the reconstruction set by a processing unit (110) executing a 2D Fourier transformation, said image subsequently being displayed on a monitor (111). In order to counteract motion artefacts, for example echo images of contours of objects in the image, the associated lines of the part of the reference set are uniformly distributed in the k-space during the generating of MR signals.

4 Claims, 5 Drawing Sheets

METHOD OF AND DEVICE FOR MAGNETIC RESONANCE IMAGING OF OBJECTS

BACKGROUND OF THE INVENTION

1. Field of the Invention

The invention relates to a method of magnetic resonance imaging of a part of a body arranged in a substantially uniform, static magnetic field, including the following steps:

a) generating and sampling first MR signals in the part of the body by application of pulse sequences of RF pulses and temporary magnetic gradient fields, said MR signals containing location-dependent information and the temporary magnetic gradient fields being applied in such a coherent manner that the first sampled MR signal values are associated with first lines in the k-space, which first lines form part of a reference set;

b) generating and sampling second MR signals in the part of the body by application of pulse sequences of RF pulses and temporary magnetic gradient fields, the temporary gradient fields being generated in such a coherent manner that the second sampled MR signal values are associated with second lines;

c) composing a reconstruction set of MR signal values from the first sampled MR signal values and the second sampled MR signal values, first sampled MR signal values in the reconstruction set being replaced by second sampled MR signal values for said second lines in the k-space;

d) reconstructing the image from the sampled MR signal values of the reconstruction set.

The invention also relates to an MR device for carrying out a method of magnetic resonance imaging of objects.

2. Description of the Related Art

A method of this kind is known from U.S. Pat. No. 4,830,012. The known method serves to execute MR imaging techniques whereby dynamic processes in the part of the body can be followed, for example the imaging of the cardiac action in the human body. It involves the continuous execution of cycles in which the MR signal values of the reconstruction set are replaced partly by second sampled MR signal values which are associated with second lines in the k-space. After each partial replacement, the image of the object is reconstructed from the reconstruction set, consisting of the sampled MR signal values of the reference set. Subsequently, the image is displayed on a monitor. In the cycle for the generating of the second MR signals according to the known method the RF pulses and temporary gradient fields are applied in such a manner that the second lines coincide with successive lines of the reference set in the k-space. It is a drawback of the known method that motion artefacts occur in the image when moving objects are imaged, for example multiple images of contours of parts of different contrast.

SUMMARY OF THE INVENTION

It is inter alia an object of the invention to counteract motion artefacts upon imaging of moving objects. To this end, the method of magnetic resonance imaging of objects in accordance with the invention is characterized in that when second MR signals are generated and sampled, the temporary magnetic gradient fields are generated in such a coherent manner that the second lines correspond substantially to various non-successive lines of the reference set.

The idea of the invention is basically that motion artefacts are counteracted during the imaging of moving parts in the body if during the sampling of the second MR signals the magnetic gradient fields are generated in such a coherent manner that the second lines are more uniformly distributed in the k-space.

The term reference set is to be understood to mean herein the set comprising the number of lines in the k-space which determine the MR signals of the reconstruction set for an image of the object having the desired resolution.

A k-space description is inter alia known from the article "The k-trajectory formulation of the NMR imaging process with applications in an analysis and synthesis of imaging methods", Med. Phys., Vol. 10, 1983, pp. 610–621. The sampling of MR signals and the processing of a slice of the object so as to form an image can be described by means of the k-space, the frequency and the phase of a MR signal thus being coupled to a position within the object via the strength of the magnetic gradient fields. The location of the sampled value with respect to the origin of the k-space is determined by the time integral of the temporary magnetic gradient fields present before and during the sampling of the MR signal. In a conventional notation, the $k_x$-axis of the k-space corresponds to the frequency of the MR signal whereas the $k_y$-axis corresponds to the phase of the MR signal.

A preferred version of the method of the invention is characterized in that the steps b), c) and d) are repeated, during a later cycle (n) in step b), when the second MR signals are generated and sampled, the temporary gradient fields being generated in such a coherent manner that the second sampled MR signal values are associated with lines in the k-space which do not correspond to the second lines of the preceding cycle (n–1), and in step c) the first sampled MR signal values are the sampled MR signal values of the reconstruction set of the preceding cycle (n–1).

The sampled MR signal values used in the reconstruction are thus continuously partly replaced, so that after the execution of a number of second cycles all sampled MR signal values of the reconstruction set have been replaced. An image is reconstructed after each partial replacement. Subsequently, the image is displayed on a monitor. Because the number of second MR signals is smaller than the number of MR signals associated with a complete measurement of the reference set, the time required for renewing a part of the sampled MR signal values of the reconstruction set is shorter than the time required for newly generating and sampling the MR signals associated with the lines of the complete reference set. The temporal resolution is thus enhanced and "real-time" images of the moving object can be obtained.

It is not necessary to generate and sample the MR signals of a complete reference set in step a). Generating and sampling MR signals associated with a number of first lines which is smaller than the total number of lines of the reference set, the first lines also being proportionally distributed in the k-space, enables formation of the reconstruction set which is supplemented, by repeated execution of the steps b) and c), by sampled MR signal values associated with the second lines, initially an image of limited resolution being reconstructed from the reconstruction set in step d). The reconstruction set is supplemented in that in step c) the MR signal values of the reconstruction set are effectively replaced by the new sampled MR signal values only after the formation of a reconstruction set comprising the complete number of lines of the reference set. Thus, a second possibility is created for obtaining "real-time" images of a moving object.

A version of the method of the invention is characterized in that when first MR signals are generated and sampled, the temporary magnetic gradient fields are applied in such a coherent manner that the first lines contain the origin of the k-space.

A radial scan or a spiral scan is thus performed, the MR signals then being sampled along a line containing the origin of the k-space. A radial scan method is inter alia known from U.S. Pat. 4,070,611. A spiral scan method is inter alia known from the article "Fast Spiral Coronary Artery Imaging" by C. H. Meyer, published in Magnetic Resonance in Medicine 28, Vol. 2, 1992, pp. 202–213. In the cited article the spiral scan method is used to image coronary arteries. The advantage of the spiral scan method and the radial scan method resides in the fact that both methods are less susceptible to artefacts in images of objects which are caused by flow in the blood vessels. A further advantage consists in that in both methods the acquisition of the MR signals is faster because of the absence of a phase encoding gradient between the excitation pulse and the read gradients during the sampling of the MR signal. Such a phase encoding gradient is present in the case of, for example a two-dimensional Fourier imaging technique.

A further version of the method of the invention is characterized in that the first lines have a spiral shape.

When a spiral scan method is used, the flow-related imaging errors, such as the non-imaging of blood vessels, are further mitigated.

An MR device for the imaging of objects in accordance with the invention, in which motion artefacts in MR images are counteracted, is characterized in that the control unit is arranged to carry out the following steps:

g) generating and sampling first MR signals by generating control signals for the means for generating the RF pulses and the temporary magnetic gradient fields in such a manner that first sampled MR signal values are associated with first lines in a k-space, which first lines form part of a reference set;

h) generating and sampling second MR signals, containing location-dependent information by generating control signals for the means for generating the RF pulses and the temporary magnetic gradient fields in such a manner that the second sampled MR signal values are associated with second lines in the k-space;

i) composing a reconstruction set of sampled MR signal values from the first sampled MR signal values and second sampled MR signals, first sampled MR signal values in the reconstruction set being replaced by second sampled signal values for said second lines in the k-space;

j) generating control signals for the processing unit in order to process the sampled MR signal values of the reconstruction set so as to form an image of the part of the body.

These and other aspects of the invention will be apparent from and elucidated with reference to the embodiments described hereinafter.

DETAILED DESCRIPTION OF THE PREFERRED EMBODIMENTS

Figure 1:
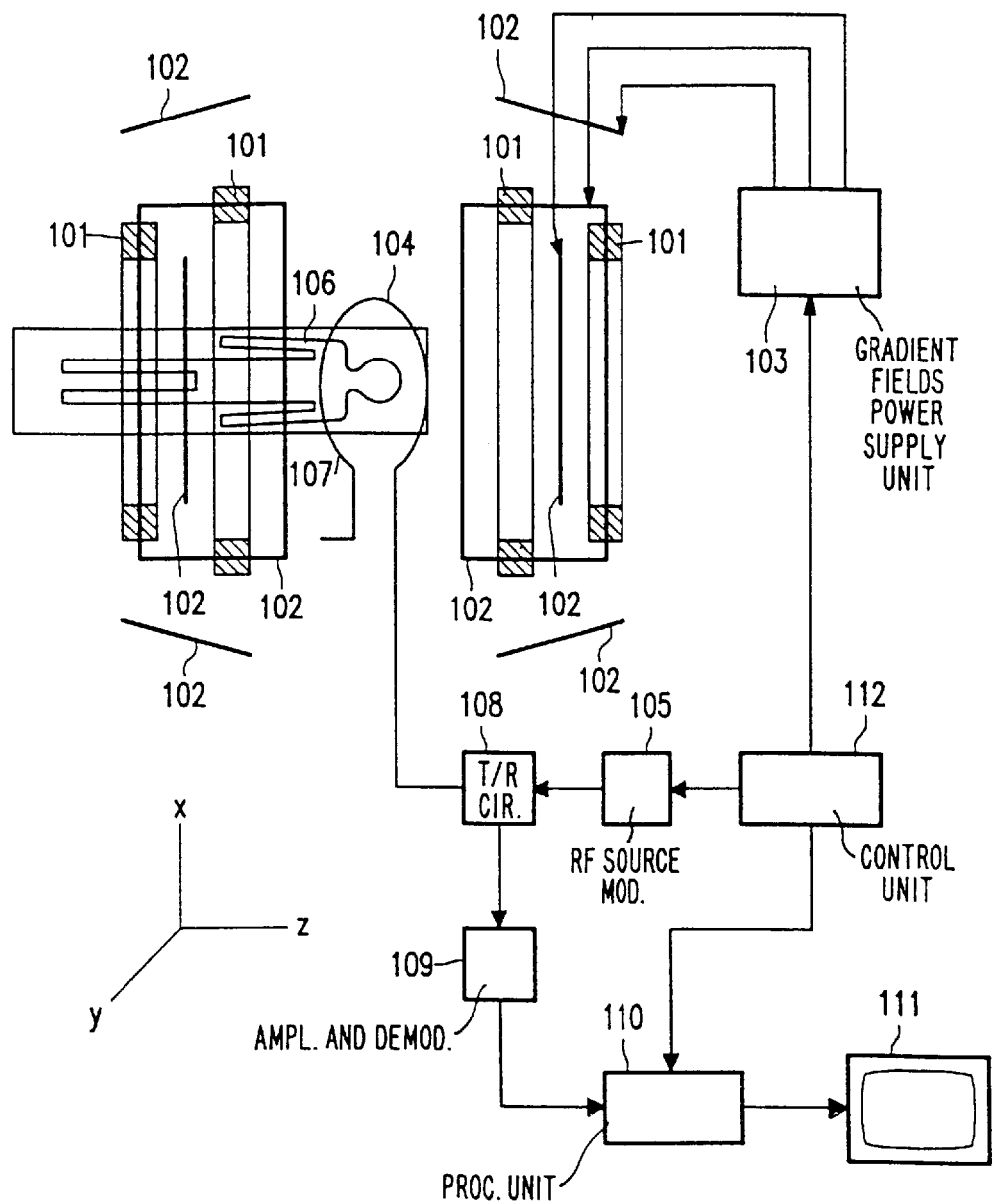
FIG. 1 shows an MR device for the imaging of objects.

FIG. 1 shows a magnetic resonance device which is known per se. The MR device 100 comprises a first magnet system 101 for generating a static magnetic field, a second magnet system 102 for generating temporary magnetic gradient fields in three orthogonal directions, and power supply units 103 for the second magnet system 102. The power supply for the first magnet system 101 is not shown. The system encloses an examination space which is large enough to accommodate a part of a body 106 to be examined. As is customary, in this figure and this description the z-direction of the coordinate system shown indicates the direction of the static magnetic field. An RF transmitter coil 104 serves to generate RF fields and is connected to an RF source and modulator 105. The RF transmitter coil 104 is arranged around or against or near a part of the patient within the examination zone. A receiver coil 107 is used to receive a magnetic resonance signal. This coil may be the same coil as the RF transmitter coil 104. The RF signal directing coil 104 is connected to a signal amplifier and demodulation unit 109, via a transmitter/receiver circuit 108. A sampled phase and a sampled amplitude are derived from the MR signals received in the signal amplifier and demodulation unit 109. Subsequently, the sampled phase and sampled amplitude are applied to a processing unit 110. The processing unit 110 processes the presented phase and amplitude by way of, for example a two-dimensional Fourier transformation so as to form an image. This image is made visible by means of a monitor 111. The magnetic resonance device 100 also comprises a control unit 112. The control unit 112 generates control signals for the RF transmitter 105, the power supply units 103 and the processing unit 110. A detailed description of magnetic resonance images and magnetic resonance devices can be found in the book "Practical NMR Imaging" by M. A. Foster and J. M. S. Hutchison, 1987, IRL Press.

Figure 2:
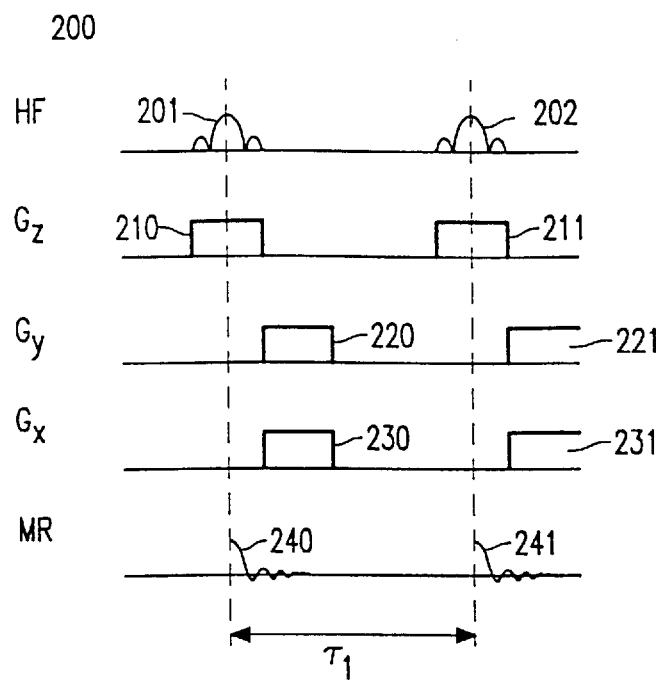
FIG. 2 shows a pulse sequence for executing a radial scan method.
Figure 3:
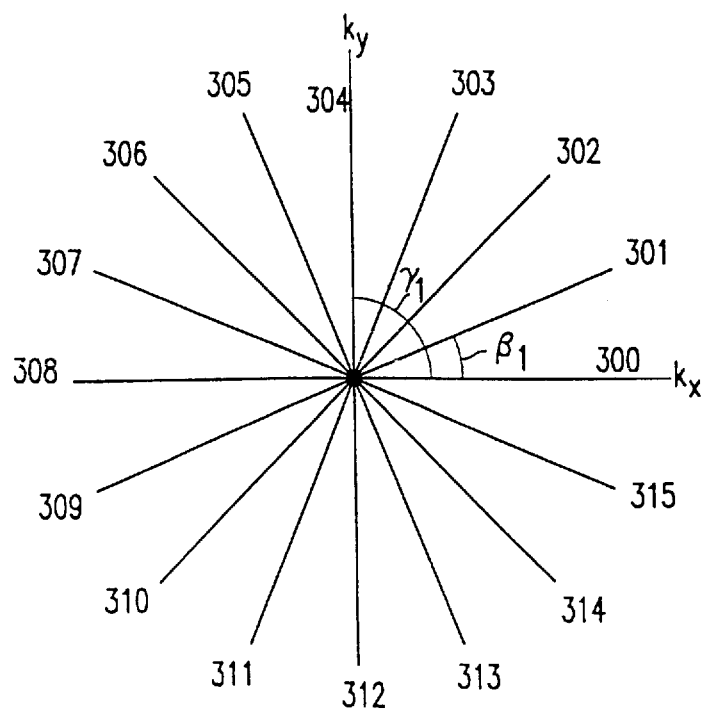
FIG. 3 shows the lines of a reference set in the k- space which are associated with a radial scan method.

An example of a radial scan method in accordance with the invention will be described with reference to the FIGS. 2 and 3. FIG. 2 shows a pulse sequence used in the radial scan method. The control unit 112 produces control signals for the RF transmitter 105 and the power supply units 103 in order to generate the pulse sequence 200 for generating a first MR signal 240 in an object. The object is, for example a part of the body 106. The pulse sequence 200 commences with an excitation pulse 201 having a flip angle $\alpha$. In the radial scan method, the flip angle $\alpha$ is between 20° and 30°. The excitation pulse 201 generates the first MR signal 240. The temporary gradient field $G_z$ is applied for spatial selection. Moreover, in order to suppress fat in the image of the object and to select a slice of the object, if desired, a spectrally and spatially selective excitation pulse may be applied. A suitable excitation pulse is then, for example a Gauss-sinc pulse. Alternatively, prior to the excitation pulse a spectrally and spatially selective pulse may be applied so as to suppress fat in the image. In order to introduce a location-dependent code in the MR signal 240, a temporary gradient field $G_x$ 230 and a temporary gradient field $G_y$ 220 are generated upon reception and sampling of the MR signal 240. After a period $\tau_1$, a next first MR signal 241 is generated by means of the excitation pulse 201 and the temporary gradient field $G_z$. The repetition time $\tau_1$ between two excitation pulses is between 2 ms and 10 ms and amounts to, for example 4 ms. In order to introduce the location-dependent code in the MR signal 241, the temporary gradient field $G_x$ 231 and the temporary gradient field $G_y$ 221 are applied again. The strengths of the temporary magnetic gradient field $G_x$ and the temporary gradient field $G_y$ determine the direction of the total gradient field u. The direction u of the gradient field corresponds to the direction of a line $k_u$ in the k-space and the location in the k-space corresponds to the time integral of the temporary gradient fields. In the present example, concerning two-dimensional images, the Fourier transform F of a nuclear spin distribution function f(x,y) in the x, y plane is mapped in the $k_x$, $k_y$ plane in the k-space. Reconstruction is performed by the transformation in which the integrals extend from $-\infty$ to $+\infty$ and it also holds that:

$$k_x = \gamma \int_{t=0}^{t} \frac{G_x}{dx}\, dt,\ k_y = \gamma \int_{t=0}^{t'} \frac{G_y}{dy}\, dt,$$

in which $\gamma$ is the gyromagnetic constant.

The reconstruction is based on the theorem that the MR signal recorded with a magnetic gradient field G in the direction u is a cross-section of $F(k_x,k_y)$ along a line $k_u$ in the k-space.

Instead of the free induction decay (FID) signal, in this version of the method of the invention use can be made of echo signals generated by means of alternative pulse sequences, for example a spin echo signal or a gradient echo signal.

In order to obtain sufficient information for a first image, during a first phase of a radial scan method in accordance with the invention a number of first MR signals, 16 in number being shown, is generated by means of the pulse sequence 200. In practice this number of MR signals will be between, for example 128 and 256. The number of 16 lines has been chosen merely for the purpose of illustration. The RF pulses and temporary magnetic gradient fields in the pulse sequence 200 are chosen so that the direction of the successive temporary gradient fields during the sampling of first MR signals corresponds to the direction of 16 respective lines 300 . . . 315 of a reference set in the k-space. FIG. 3 shows the 16 lines 300 . . . 315 of the reference set. In order to achieve a uniform distribution of N lines in the k-space in the case of a radial scan method or a spiral scan method, the angle $\beta$ between two successive lines amounts to $2\pi/N$ radians. In the case of the 16 lines of FIG. 3, the angle $\beta_1$ between two successive lines in the k-space then amounts to $2\pi/16$ radians. A reconstruction set is formed from the first sampled MR signal values associated with the first lines 300 . . . 315. Using the processing unit 110, an image is reconstructed from the reconstruction set by back projection. An alternative possibility consists in that the processing unit 110 interpolates, using a two-dimensional gridding function, the sampled MR signal values to MR signal values associated with an orthogonal grid in the k-space, after which a 2D Fourier transformation is applied so as to reconstruct an image of the interpolated MR signal values. Instead of a simple interpolation algorithm, the 2D gridding function may also comprise more advanced gridding algorithms. An example in this respect is an algorithm which comprises a convolution of the sampled data points with a sinc function and in which subsequently a transformation to an orthogonal grid is performed as described in the article "A Fast Sinc Function Gridding Algorithm for Fourier Inversion in Computer Tomography" by J. D. O'Sullivan, published in IEEE Transactions on Medical Imaging, Vol. MI-4, No. 4, December 1985, pp. 202–207. Subsequently, an image of the object is reconstructed from the interpolated reconstruction set by means of a two-dimensional Fourier transformation. The reconstructed image can be displayed on the monitor 111.

During a second phase of the radial scan method in accordance with the invention a number of, for example four second MR signals is generated by means of the pulse sequence 200 during a cycle (n), the direction of the successive gradient fields during the sampling of the second MR signals corresponding to the direction of four successive second lines uniformly distributed in the k-space. The angle $\gamma_1$ between the two successive second lines then amounts to $2\pi/4$ radians. The four second lines associated with the second sampled MR signal values are, for example the four lines 300, 304, 308, 312 in FIG. 3. Subsequently, in the reconstruction set the sampled MR signal values associated with the four first lines 300, 304, 308 and 312 in the k-space are replaced by the second sampled MR signal values. Furthermore, an image is reconstructed by means of the processing unit 110 by successive application of the 2D grid function and the 2D Fourier transformation to the reconstruction set. The reconstructed image is displayed on the monitor 111.

The cycle (n) is continuously repeated for the imaging of a dynamic process in a part of the body 106, four successive second lines associated with the second sampled MR signal values of a next cycle (n+1) then being rotated each time through an angle $\beta_1$ with respect to the four second lines associated with the previous cycle (n). In FIG. 3 the four lines 301, 305, 309, 313 are associated with the second sampled MR signal values of a next cycle (n+1); similarly, the four lines 302, 306, 310 and 314 are associated with the cycle (n+2), and the four lines 303, 307, 311 and 315 are associated with the cycle (n+3).

Other sequences of the second lines associated with the second sampled MR signal values of the cycle (n) are also feasible. For example, a sequence in which four second lines of a cycle (n+1) are rotated with respect to four second lines of a preceding cycle (n) through an angle $2*\beta_1$ for n is even and through an angle $-\beta_1$ for n is odd. Thus, for the cycle (n) the four lines 300, 304, 308, 312; for the cycle (n+1) the four lines 302, 306, 310, 314; and for the cycle (n+2) the four lines 301, 305, 309, 313. Thus, an imaging frequency of between 10 and 25 images per second can be achieved. An alternative version of this method is to omit the first phase and to execute continuously cycles of the second phase only. The reconstruction set is then formed by the successive sampled MR signal values of cycles of the second phase. In the described example an image of the object then becomes available with maximum resolution after the execution of four cycles.

In order to stimulate the efficient switching of the gradient fields, it is alternatively possible to sample various successive parts of a first line in the k-space in one excitation. To this end, for example the following pulse sequences can be used: a RARE (Rapid Acquisition by Repeated Echos) or TSE (Turbo Spin Echo) pulse sequence which comprises an excitation pulse $\alpha$ and several 180° refocussing pulses, a spin echo signal being generated after each 180° refocussing pulse; an FFE (Fast Field Echo) or TFE (Turbo Field Echo) pulse sequence which generates (several gradient echo signals by means of an excitation pulse α and a magnetic gradient field of alternating polarity; or a GRASE (Gradient And Spin Echo) pulse sequence which comprises an excitation pulse α and several 180° pulses, several gradient echo signals being generated between two successive 180° pulses by application of temporary magnetic gradient fields of alternating polarity.

Figure 4:
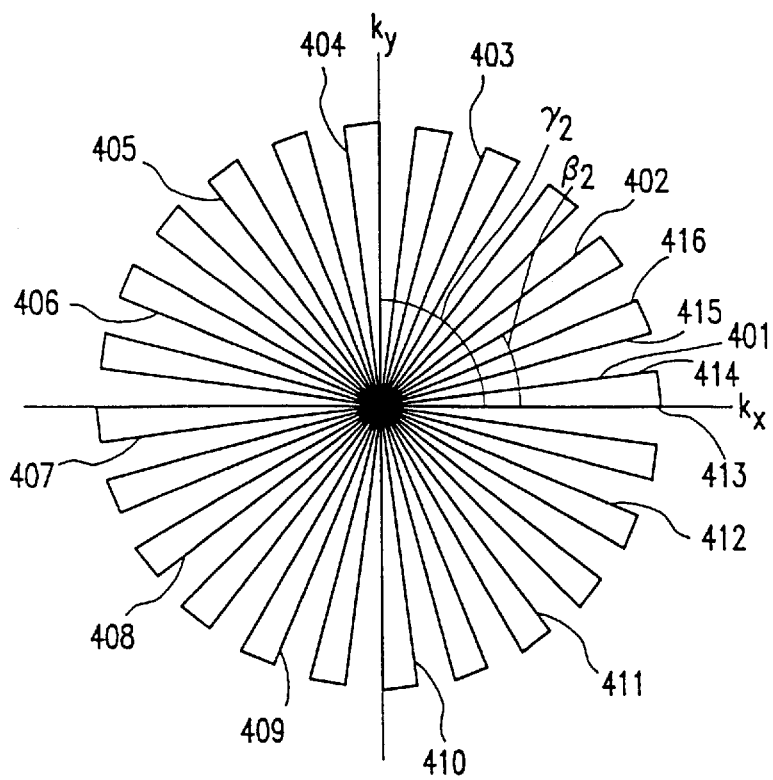
FIG. 4 shows the lines of a reference set in the k- space which are associated with a second radial scan method.
Figure 5:
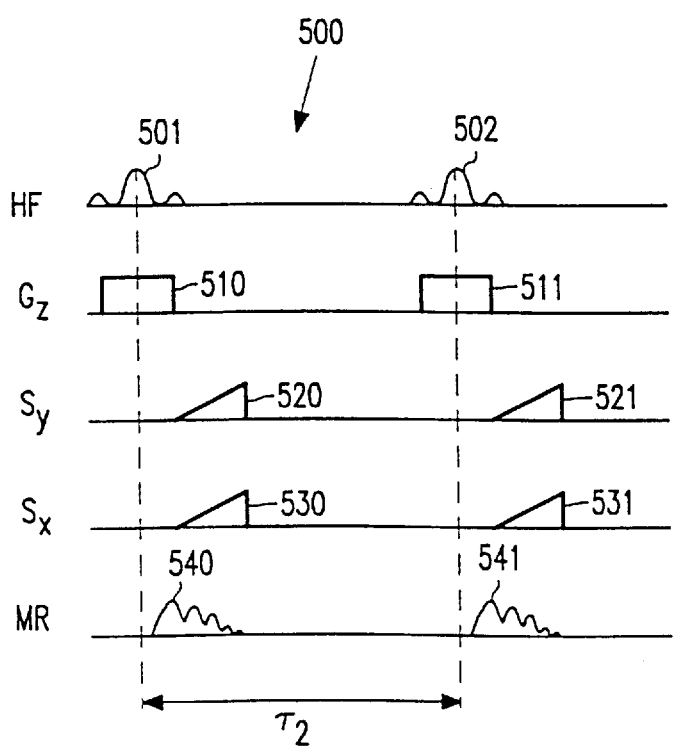
FIG. 5 shows a pulse sequence for executing a spiral scan method.
Figure 6:
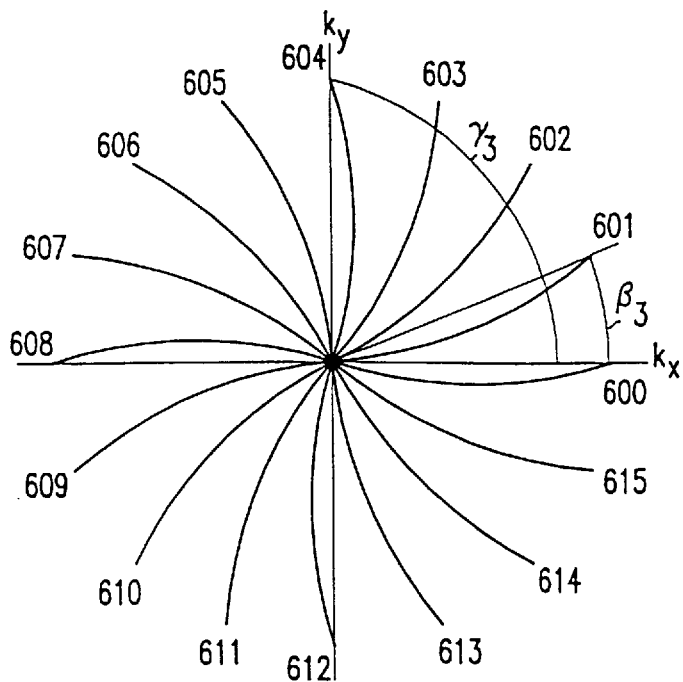
FIG. 6 shows the lines of a reference set in the k- space which are associated with a spiral scan method.

This version of the method of the invention is used, for example, in a radial scan method but can also be used in combination with a spiral scan method as described with reference to the FIGS. 5 and 6. The radial scan method is described with reference to FIG. 4. During a first phase of this radial scan method, the RF pulses and temporary magnetic gradient fields are chosen so that the direction of the successive temporary gradient fields during the sampling of first MR signals corresponds to the direction of 12 respective lines 401 . . . 412 in the k-space as shown in FIG. 4. In practice this number will be higher, for example between 32 and 64. The number 12 has been chosen merely for the purpose of illustration. The 12 lines 401 . . . 412 are also uniformly distributed across the k-space. Per excitation four parts, for example the four parts 413, 414, 415 and 416, of a first line in the k-space are successively sampled. Subsequently, using eleven successive excitations the next eleven first MR signals, associated with the eleven first lines 402 . . . 412, are sampled. The angle $\beta_2$ between two successive first lines then amounts to $\pi/6$ radians. Subsequently, a reconstruction set is formed again by the first sampled MR signal values. Using the processing unit 110, an image is reconstructed from the reconstruction set by means of a 2D gridding function, succeeded by a 2D Fourier transformation. The image can subsequently be displayed on the monitor 111.

During a second phase of the radial scan method in accordance with the invention, a number of, for example four, second MR signals is generated during a cycle (m). The second sampled MR signal values are associated with four second lines which are uniformly distributed in the k-space and correspond to, for example the first four lines 401, 404, 407, 410 in FIG. 4, the angle $\gamma_2$ between two successive second lines amounting to $\pi/4$. Subsequently, in the reconstruction set the sampled MR signal values associated with the four first lines 401, 404, 407 and 410 are replaced by the second sampled MR signal values. From the reconstruction set an image is reconstructed, by way of a 2D grid function and a 2D Fourier transformation, for display on the monitor 111.

In order to follow a dynamic process in a part of the body 106, the cycle (n) is continuously repeated, four successive second lines associated with the second sampled MR signal values of a next cycle (n+1) always being rotated through an angle $\beta_2$ with respect to the four second lines associated with the preceding cycle (m). In FIG. 4 the four lines 402, 405, 408, 411 are associated with a next cycle (n+2), and the four lines 403, 406, 409, 412 are associated with a next cycle yet (n+3). A deviating sequence can again be used to step along the lines of the reference set in the k-space, for example a sequence realised in exactly the same way as the sequence described with reference to FIG. 3. An alternative version of this method consists in omitting the first phase and continuously executing cycles of the second phase only. The reconstruction set is then formed by the successive sampled MR signal values of cycles of the second phase. In the described example an image of the object then becomes available with maximum resolution after the execution of four cycles.

A next version of the method of the invention concerns a spiral scan method in which each spiral contains the origin of the k-space. The spiral scan method will be described in detail with reference to the FIGS. 5 and 6. An example of a spiral in the k-space is described by the formula $k=A\tau(t)e^{i\omega(t)}$, in which A is a constant, $\tau(t)$ is a function of t, and $\omega$ is the angular frequency. FIG. 5 shows a pulse sequence 500 for generating first MR signals according to a spiral scan method. The pulse series 500 commences with an excitation pulse 501 having a flip angle α. The flip angle α is, for example 90°. The excitation pulse 501 generates a first MR signal 540. In order to suppress fat in the image, if desired a spectrally and spatially selective pulse can be applied for the excitation pulse, for example a Gauss-sinc pulse. It is alternatively possible to apply a spectrally and spatially selective pulse for the suppression of fat prior to the excitation pulse. In order to introduce a location-dependent code, the temporary magnetic gradient field $G_x$ 530 and the temporary magnetic gradient field $G_y$ 520 are generated upon reception of the MR signal 540. The strengths of the temporary gradient field $G_x$ 530 and the temporary gradient field $G_y$ 520 determine the direction of the total gradient field u, corresponding to the instantaneous direction of a spiral-shaped line $k_u$ in a k-space. After a period $\tau_2$, an excitation pulse 502 is applied again in order to generate a next first MR signal 541, followed by the application of the temporary gradient field $G_x$ 531 and the temporary gradient field $G_y$ 521 during the measurement of the MR signal 551. The repetition time $\tau_2$ between two excitation pulses is between 2 ms and 10 ms and amounts to, for example 4 ms.

During a first phase of the method of the invention, the pulse sequence 500 is repeated so as to obtain sufficient information, the RF pulses and temporary magnetic gradient fields being chosen so that the direction of the successive temporary gradient fields during the sampling of first MR signals corresponds to the direction of 16 respective first spirals 600 . . . 615 in the k-space, said spirals constituting a reference set. FIG. 6 shows the 16 spirals 600 . . . 615 which are uniformly distributed in the k- space. The angle $\beta_3$ between two successive first spirals in this case amounts to $\pi/16$ radians. The reconstruction set is formed from the first sampled MR signal values. The processing unit 110 reconstructs an image from the reconstruction set by successively executing a 2D grid function and a Fourier transformation.

During a second phase of the method of the invention, a second number of, for example four MR signals is generated during a cycle (n), the direction of the gradient fields then corresponding to four second spirals which are uniformly distributed in the k-space, the angle $\gamma_3$ between two successive spirals amounting to $2\pi/4$ radians. These are, for example, the four spirals 601, 605, 609, 613 in FIG. 6. Subsequently, in the reconstruction set the sampled MR signal values associated with the four corresponding first spirals 601, 605, 609, 613 are replaced by second sampled MR signal values, after which the processing unit 110 again reconstructs an image from the reconstruction set by successively executing a 2D grid function and a 2D Fourier transformation. The reconstructed image can subsequently be displayed on the monitor 111.

In order to follow a dynamic process in a part of the body 106, the cycle (n) is continuously repeated, the four second spirals in the k-space of a next cycle (n+1) being rotated through an angle $\beta_3$ with respect to the four second spirals associated with the preceding cycle (n). For example, in FIG. 6 the four spirals 601, 605, 609, 613 are associated with a next cycle (n+2), and similarly the four spirals 602, 606, 610, 614 are associated with another cycle yet (n+3), etc. A different sequence for stepping through the k-space along the spirals of the reference set is again possible. An alternative version of this method consists in omitting the first phase and in executing continuously cycles of the second phase only. The reconstruction set is then formed by the successive sampled MR signal values of cycles of the second phase. In the described example an image of the object then becomes available with maximum resolution after the execution of four cycles.

Figure 7:
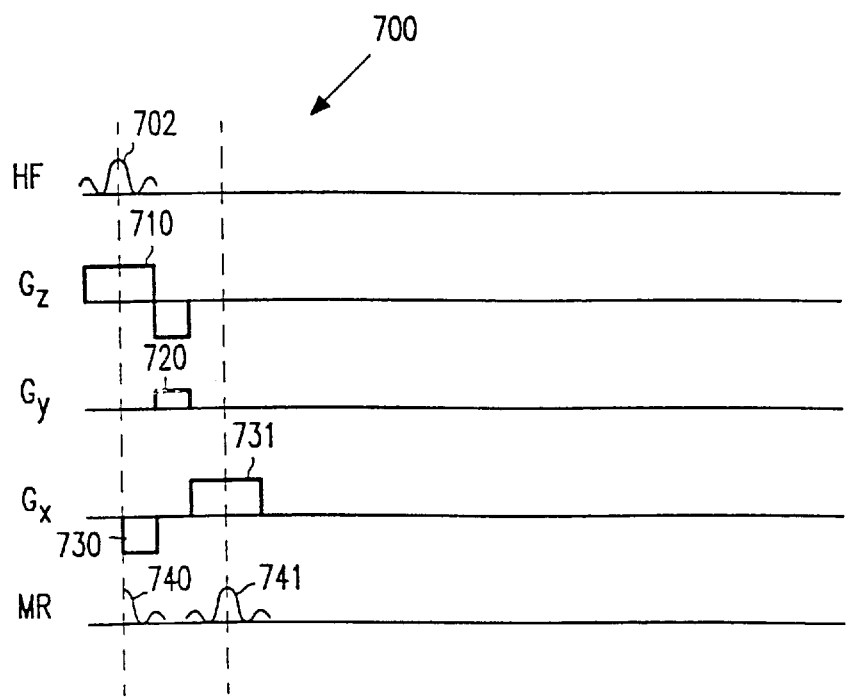
FIG. 7 shows a pulse sequence for executing a linear scan method.

Finally, the method of the invention can also be used for a linear scan method in which scanning takes place along parallel lines in the k-space, for example along a number of lines parallel to the $k_x$-axis. This method will be described in detail with reference to the FIGS. 7 and 8. FIG. 7 shows a pulse sequence 700 for generating first MR signals for a linear scan method in accordance with the invention. The pulse sequence 700 commences with an excitation pulse 701 having a flip angle α. The flip angle α is, for example 90°. The excitation pulse 701 generates a first MR signal 740. In order to suppress fat in the image, if desired, a spectrally and spatially selective pulse can be applied for the excitation pulse, for example a Gauss-sinc pulse. It is alternatively possible to apply a spectrally and spatially selective pulse for the suppression of fat prior to the excitation pulse. The temporary magnetic gradient field $G_z$ provides spatial selection of a slice in the body 106. Because of the dephasing effect of the temporary magnetic gradient field $G_x$ 730 on the nuclear spins, the first MR signal 740 is directly attenuated. In order to introduce a phase code into the second MR signal 741, the temporary magnetic gradient field $G_y$ 720 is applied. Furthermore, in order to introduce a frequency code into the second MR signal 741, the temporary magnetic gradient field $G_x$ 731 is applied upon reception of the MR signal 741; moreover, the temporary magnetic gradient field $G_x$ rephases the nuclear spins, thus producing the second MR signal 741. The time integral of the temporary gradient field $G_x$ 731 and the temporary gradient field $G_y$ 720 determine the location of the line $k_u$ in the k-space. Furthermore, the repetition time $\tau_2$ between two excitation pulses may be between 2 ms and 10 ms and amounts to, for example 4 ms.

Figure 8:
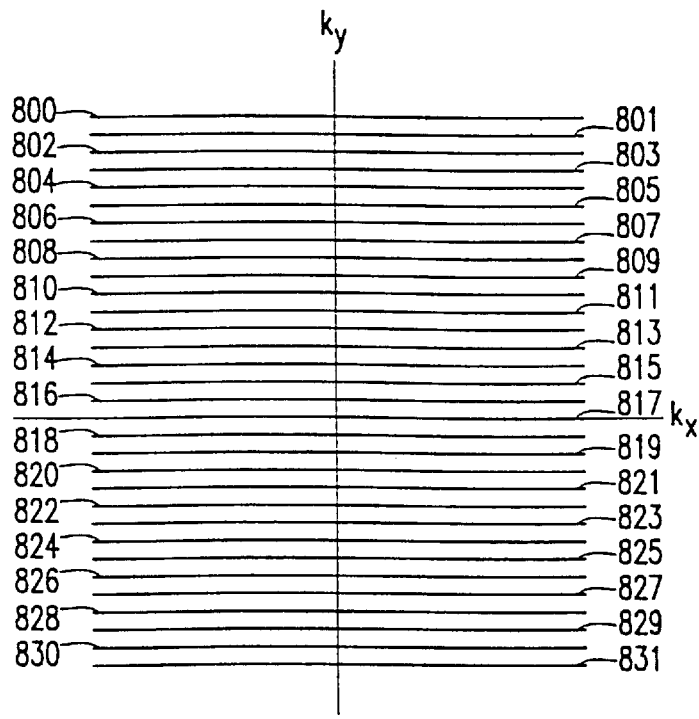
FIG. 8 shows the lines of a reference set in the k- space which are associated with a linear scan method.

During a first phase of the method of the invention, the pulse sequence 700 is repeated in order to obtain sufficient information, the RF pulses and temporary magnetic gradient fields then being chosen so that the direction of the successive temporary gradient fields corresponds to the direction of the respective 32 first lines in the k-space during the sampling of first MR signals. In practice this number is, for example between 128 and 256. The number 32 has been chosen merely by way of example for purposes of illustration. FIG. 8 shows the 32 first lines 800 . . . 831. The lines 800–831 are uniformly distributed in the k-space and form a reference set. The reconstruction set is formed from the first sampled MR signal values. The processing unit 110 reconstructs an image from the reconstruction set by executing of a 2D Fourier transformation.

During a second phase of the method in accordance with the invention a second number of, for example four MR signals is generated in a cycle (n), the direction of the gradient fields then corresponding to four second lines which are uniformly distributed in the k-space. For example, these are the four lines 800, 808, 816, 824 in FIG. 8. Subsequently, in the reconstruction set the sampled MR signal values associated with the four corresponding first lines 800, 808, 816, 824 are replaced by second sampled MR signal values. Subsequently, the processing unit 110 again reconstructs an image from the reconstruction set by executing a 2D Fourier transformation. The reconstructed image can be displayed on the monitor 111.

In order to follow a dynamic process in a part of the body 106, the cycle (n) is continuously repeated, the four second lines in the k-space of a next cycle (n+1) having been shifted a distance $\Delta k_y$ relative to the four second lines associated with the preceding cycle (n). In the present example the distance $\Delta k_y$ corresponds to the distance between two successive lines of the reference set in the k-space. In the example shown in FIG. 8, the four lines 801, 809, 817, 825 are associated with a next cycle (n+2); similarly, the four lines 802, 810, 818, 826 are associated with a next cycle yet (n+3), etc. A deviating sequence of lines of the reference set for stepping through the k-space is possible again. Moreover, with a view to stimulating the efficiency of switching of the gradient fields it is also possible to sample various successive parts of a line in the k-space in one excitation. This can be realized, for example by applying RARE or TSE pulse sequences, FFE or TFE pulse sequences, or GRASE pulse sequences. This method will be described with reference to FIG. 9.

Figure 9:
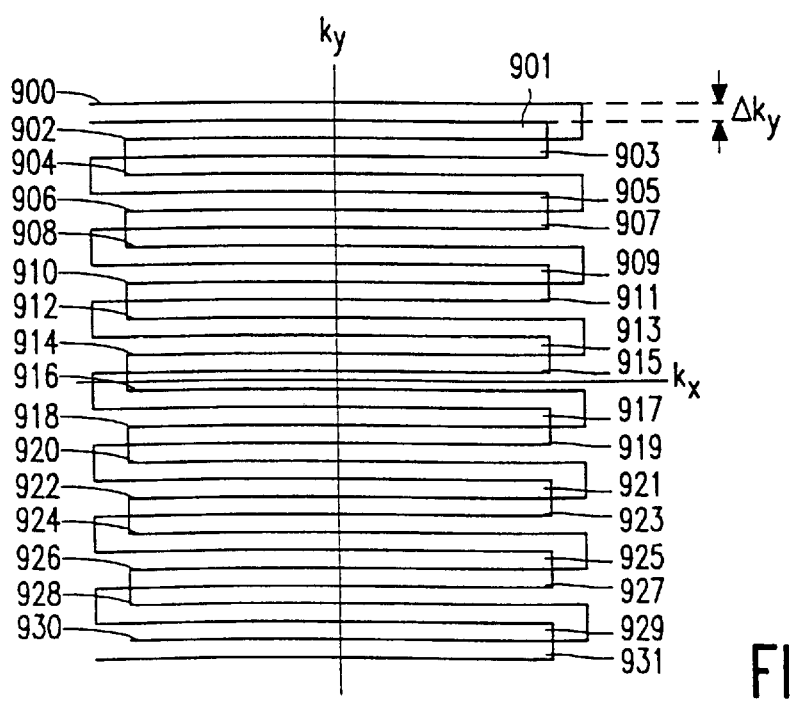
FIG. 9 shows the lines of a reference set in the k- space which are associated with a second linear scan method.

During a first phase of the method of the invention, a pulse sequence is applied in order to obtain sufficient information, said pulse sequence generating several successive gradient echo signals or spin echo signals, the RF pulses and temporary magnetic gradient fields then being chosen so that the direction of the successive temporary gradient fields during the sampling of first MR signals corresponds to the direction of 32 respective line segments in the k-space, which line segments constitute a line of a reference set. The number of 32 line segments has been chosen by way of example. This number will be between 128 and 256 in practice. FIG. 9 shows 32 line segments 900–931. The reconstruction set is formed from the first sampled MR signal values. The processing unit 110 reconstructs an image from the reconstruction set by executing a 2D Fourier transformation.

During a second phase of the method of the invention 16 MR signals are generated in a cycle (n) by means of a pulse sequence which comprises an excitation pulse and temporary magnetic gradient fields, the time integral of the temporary gradient fields corresponding to a line which is composed of line segments which are uniformly distributed in the k-space. This is, for example, a line which is composed of the 16 odd line segments 901–931 in FIG. 9. Subsequently, in the reconstruction set the sampled MR signal values associated with the corresponding first line composed of the 16 odd line segments 901–931, are replaced by second sampled MR signal values, after which the processing unit 110 reconstructs an image again from the reconstruction set by executing a 2D Fourier transformation. The reconstructed image of a part of the body can subsequently be displayed on the monitor 111.

In order to follow a dynamic process in a part of the body 106, the cycle (n) is continuously repeated, the line composed of 16 line segments in the k-space of a next cycle (n+1) having been shifted a distance $\Delta k_y$ with respect to the line associated with the preceding cycle (n). The distance $\Delta k_y$ in the example shown in FIG. 9 corresponds to the distance between two successive line segments in the reference set. Furthermore, in FIG. 9, for example the 16 even line segments 900–930 are associated with a line which relates to a next cycle (n+1), and the 16 odd line segments 901–931 are associated with a line relating to another cycle yet (n+3), etc.

A version of this method consists in omitting the first phase and in continuously executing cycles of the second phase only. The reconstruction set is then formed by the successively sampled MR signal values of cycles of the second phase. In the described example an image having the resolution of the reference set then becomes available after the execution of two cycles.

We claim:

1. A method of magnetic resonance imaging of a part of a body arranged in a substantially uniform, static magnetic field, which method comprises the following steps:

a) generating and sampling first MR signals in the part of the body by application of pulse sequences of RF pulses and temporary magnetic gradient fields, said MR signals containing location-dependent information, and the temporary magnetic gradient fields being applied in such a coherent manner that the first sampled MR signal values are associated with first lines in a k-space which contain the origin of the k-space and have a spiral shape, which first lines form part of a reference set;

b) generating and sampling second MR signals in the part of the body by application of pulse sequences of RF pulses and temporary magnetic gradient fields, the temporary gradient fields being generated in such a coherent manner that the second sampled MR signal values are associated with second lines in the k-space;

c) composing a reconstruction set of MR signal values from the first sampled MR signal values and the second sampled MR signal values in a manner that first sampled MR signal values in the reconstruction set are replaced by second sampled MR signal values associated with a plurality of said second lines in the k-space; and d) reconstructing an image from the sampled MR signal values of the reconstruction set;

wherein when second MR signals are generated and sampled, the temporary magnetic gradient fields are generated in such a coherent manner that the second lines correspond substantially to various lines of the reference set which are non-successive in the k-space.

2. A method as claimed in claim 1, wherein the steps b), c) and d) are repeated in successive cycles, and during a later cycle in step b), when the second MR signals are generated and sampled, the temporary gradient fields are generated in such a coherent manner that the second sampled MR signal values are associated with lines in the k-space which do not correspond to the second lines of the preceding cycle, and in step c) the first sampled MR signal values are the sampled MR signal values of the reconstruction set of the preceding cycle.

3. An MR device for magnetic resonance imaging of a part of a body which is arranged in a substantially uniform, static magnetic field, comprising means for sustaining the static magnetic field, means for generating RF pulses, means for generating temporary magnetic gradient fields, a control unit configured for generating control signals for the means for generating the RF pulses and for the means for generating the temporary magnetic gradient fields, means for receiving, demodulating and sampling the MR signals, and a processing unit for processing the sampled MR signals, wherein the control unit is also configured for carrying out the following steps:

a) generating and sampling first MR signals by generating control signals for the means for generating the RF pulses and the temporary magnetic gradient fields in such a manner that first sampled MR signal values are associated with first lines in a k-space which contain the origin of the k-space and have a spiral shape, which first lines form part of a reference set;

b) generating and sampling second MR signals, containing location-dependent information, by generating control signals for the means for generating the RF pulses and the temporary magnetic gradient fields in such a manner that the second sampled MR signal values are associated with second lines in the k-space;

c) composing a reconstruction set of sampled MR signal values from the first sampled MR signal values and second sampled MR signals in a manner that first sampled MR signals in the reconstruction set are replaced by second sampled MR signal values associated with a plurality of said second lines in the k-space; and d) generating control signals for the processing unit in order to process the sampled MR signal values of the reconstruction set so as to form an image of the part of the body;

wherein when second MR signals are generated and sampled, the temporary magnetic gradient fields are generated in such a coherent manner that the second lines correspond substantially to various lines of the reference set which are non-successive in the k-space.

4. An MR device as claimed in claim 3, wherein the steps b), c) and d) are repeated in successive cycles, and during a later cycle in step b), when the second MR signals are generated and sampled, the temporary gradient fields are generated in such a coherent manner that the second sampled MR signal values are associated with lines in the k-space which do not correspond to the second lines of the preceding cycle, and in step c) the first sampled MR signal values are the sampled MR signal values of the reconstruction set of the preceding cycle.

* * * * *